(12) United States Patent
Jin et al.

(10) Patent No.: US 9,349,756 B2
(45) Date of Patent: May 24, 2016

(54) ARRAY SUBSTRATE, DISPLAY PANEL AND DISPLAY DEVICE

(71) Applicants: Shanghai AVIC Optoelectronics Co., Ltd., Shanghai (CN); Tianma Micro-Electronics Co., Ltd., Shenzhen (CN)

(72) Inventors: Huijun Jin, Shanghai (CN); Yansong Li, Shanghai (CN); Miaomiao Wang, Shanghai (CN); Xin Xu, Shanghai (CN); Wantong Shao, Shanghai (CN)

(73) Assignees: Tianma Micro-Electronics Co., Ltd., Shenzhen (CN); Shanghai AVIC Optoelectronics Co., Ltd., Shanghai (CN)

( * ) Notice: Subject to any disclaimer, the term of this patent is extended or adjusted under 35 U.S.C. 154(b) by 0 days.

(21) Appl. No.: 14/562,753

(22) Filed: Dec. 7, 2014

(65) Prior Publication Data
US 2016/0071883 A1  Mar. 10, 2016

(30) Foreign Application Priority Data
Sep. 9, 2014  (CN) .......................... 2014 1 0455688

(51) Int. Cl.
| | | |
|---|---|---|
| *G02F 1/1343* | (2006.01) | |
| *G02B 27/22* | (2006.01) | |
| *H01L 27/12* | (2006.01) | |
| *H01L 29/40* | (2006.01) | |
| *H01L 29/786* | (2006.01) | |

(52) U.S. Cl.
CPC .......... *H01L 27/124* (2013.01); *G02F 1/13439* (2013.01); *G02F 1/134336* (2013.01); *H01L 29/40* (2013.01); *H01L 29/786* (2013.01); *G02F 2001/134345* (2013.01)

(58) Field of Classification Search
CPC ..... H01L 27/124; H01L 29/786; H01L 29/40; G02F 1/134336; G02F 1/13439; G02F 2001/134345
See application file for complete search history.

(56) References Cited

U.S. PATENT DOCUMENTS

| | | |
|---|---|---|
| 7,259,812 B2 | 8/2007 | Park et al. |
| 7,317,503 B2 | 1/2008 | Lee et al. |
| 8,049,855 B2 | 11/2011 | Tanaka |
| 8,253,884 B2 | 8/2012 | Miyachi |
| 8,982,309 B2 | 3/2015 | Jang et al. |
| 2004/0227890 A1 | 11/2004 | Chung et al. |
| 2004/0263748 A1 | 12/2004 | Park et al. |
| 2005/0140907 A1 | 6/2005 | Yun |
| 2009/0009671 A1 | 1/2009 | Wakabayashi |

FOREIGN PATENT DOCUMENTS

| | | |
|---|---|---|
| JP | 2013117674 A | 6/2013 |
| KR | 20120130582 A | 12/2003 |

*Primary Examiner* — Joseph L Williams
(74) *Attorney, Agent, or Firm* — Faegre Baker Daniels LLP

(57) ABSTRACT

An array substrate including a plurality of pixel units each including a 2×2 sub-pixel area matrix, where each of the sub-pixel areas includes three sub-pixel electrodes. The strip electrode of at least one of the sub-pixel electrodes from each of the first sub-pixel area and the third sub-pixel area is parallel to a first direction, and the strip electrode of at least one of the sub-pixel electrodes from each of the second sub-pixel area and the fourth sub-pixel area is parallel to a second direction. The first direction intersects with the second direction. Also, a first area is defined by the sub-pixel electrodes including the strip electrodes parallel to the first direction and the sub-pixel electrodes including the strip electrodes parallel to the second direction, and the first area is provided with a sub-pixel switch.

22 Claims, 10 Drawing Sheets

ARRAY SUBSTRATE, DISPLAY PANEL AND DISPLAY DEVICE

CROSS-REFERENCE TO RELATED APPLICATION

This application claims priority to Chinese Application No. 201410455688.2 filed on Sep. 9, 2014, entitled "Array Substrate, Display Panel and Display Device", the disclosure of which is incorporated herein by reference in its entirety.

BACKGROUND

Due to their advantages such as light weight, small thickness, low power consumption and low radiation, liquid crystal display devices have been widely used in various fields. With the development of liquid crystal display technologies, the liquid crystal display devices have continually improved display effects.

In some liquid crystal display devices, strip electrodes from rows of pixel electrodes on the array substrate are arranged in a pseudo dual-domain structure, such that for the strip electrodes from any two adjacent rows of pixel electrodes, the strip electrodes from one of the two adjacent rows of pixel electrodes are parallel with a first direction that is different from a second direction with which the strip electrodes from the other one of the two adjacent rows of pixel electrodes are parallel. In the process of manufacturing the liquid crystal display device, if a rubbing orientation direction is deviated in rubbing or a polarizer is deviated in adhering, then luminance corresponding to odd rows of pixel electrodes and luminance corresponding to even rows of pixel electrodes are uneven while displaying, thereby generating transverse striations in the liquid crystal display device.

SUMMARY

The embodiments of the disclosure provide an array substrate, a display panel and a display device, which solve the problem that when a rubbing orientation direction is deviated in rubbing or a polarizer is deviated in adhering the luminance corresponding to odd rows of pixel electrodes and luminance corresponding to even rows of pixel electrodes are uneven while displaying thereby generating transverse striations in the liquid crystal display device.

Embodiments of the disclosure provide an array substrate, including: a plurality of pixel units each comprising a 2×2 sub-pixel area matrix, with the 2×2 sub-pixel area matrix comprising a first sub-pixel area, a second sub-pixel area, a third sub-pixel area and a fourth sub-pixel area arranged in sequence; wherein each of the sub-pixel areas comprises at least two sub-pixel electrodes;

each of the sub-pixel electrodes comprises a strip electrode;

the strip electrode of at least one of the sub-pixel electrodes from each of the first sub-pixel area and the third sub-pixel area is parallel to a first direction;

the strip electrode of at least one of the sub-pixel electrodes from each of the second sub-pixel area and the fourth sub-pixel area is parallel to a second direction;

the first direction intersects with the second direction, to form an angle larger than 0° and smaller than or equal to 90° between the first direction and the second direction;

wherein, a first area is defined by the sub-pixel electrodes comprising the strip electrodes parallel to the first direction and the sub-pixel electrodes comprising the strip electrodes parallel to the second direction, and is provided with a sub-pixel switch.

Some embodiments of the disclosure provide a display panel, including: a first substrate, a second substrate, and a liquid crystal layer located between the first substrate and the second substrate, wherein, the first substrate includes the above array substrate.

Some embodiments of the disclosure provide a display device, including the above display panel.

With the array substrate, the display panel and the display device according to the embodiments of the disclosure, each row of the sub-pixel electrodes include both strip electrodes parallel to the first direction and strip electrodes parallel to the second direction, such that, if the rubbing orientation direction is deviated in rubbing or the polarizer is deviated in adhering, high luminance and low luminance corresponding to sub-pixel electrodes in each row of sub-pixel electrodes on the array substrate alternate and no distinct luminance difference is present between the odd and even rows of sub-pixel electrodes, thereby avoiding the problem of the transverse striation.

While multiple embodiments are disclosed, still other embodiments will become apparent to those skilled in the art from the following detailed description, which shows and describes illustrative embodiments. Accordingly, the drawings and detailed description are to be regarded as illustrative in nature and not restrictive.

Figure 1A:
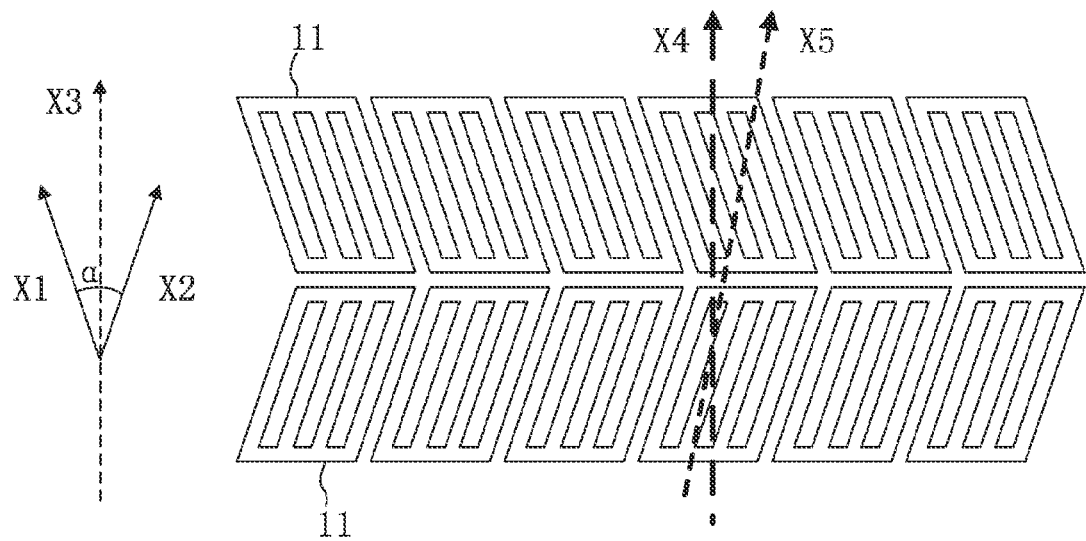
FIG. 1A is a schematic diagram of the structure of a pixel electrode in the related art.

Embodiments have been shown by way of example in the drawings and are described in detail below. The intention is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The technical solutions in embodiments of the disclosure are described clearly and completely below in combination with the drawings accompanying the embodiments of the disclosure. Obviously, merely some embodiments, rather than all embodiments, are described herein. Based on the described embodiments, all other embodiments obtained by those skilled in the art shall fall into the scope of protection of the present disclosure.

In a liquid crystal display device, an electric field formed between a pixel electrode and a common electrode is used to control rotation of liquid crystal molecules, to achieve a display effect of the liquid crystal display device. Thus an arrangement pattern of strip electrodes from each row of pixel electrodes may affect the electric field formed between the pixel electrodes and the common electrode, thereby affecting rotation of the liquid crystal molecules and the display effect of the liquid crystal display device.

FIG. 1A is a schematic diagram of the structure of a pixel electrode in the related art. Referring to FIG. 1A, among any two adjacent rows of pixel electrodes 11 on an array substrate in the liquid crystal display device, a first row of pixel electrodes 11 (which is an odd or even row of pixel electrodes on the array substrate) includes strip electrodes all parallel to a first direction X1, a second row of pixel electrodes 11 (which is an even row or odd row of pixel electrodes on the array substrate) includes strip electrodes all parallel to a second direction X2, and an angle between the first direction X1 and the second direction X2 is α, thereby forming the pseudo dual-domain structure of the arrangement of the strip electrodes in the related art. Additionally, as shown in FIG. 1A, a dashed line X3 with an arrow represents the direction of angle bisector of the angle α, and the pixel electrodes in the same column on the array substrate have the same color (not shown), and hence all may be red pixel electrodes, green pixel electrodes, blue pixel electrodes or white pixel electrodes, for example.

For the arrangement pattern of the strip electrodes from each row of pixel electrodes 11 in FIG. 1A, the rubbing orientation direction as well as a polarization direction of the polarizer are required to be consistent with the direction X3 of angle bisector of the angle α in manufacturing the liquid crystal display device in order to ensure a good display effect. If the polarizer is deviated in adhering, the polarization direction of the polarizer is inconsistent with the direction X3 of angle bisector of the angle α. As shown in FIG. 1A, the direction X3 of angle bisector of the angle α is consistent with a rubbing orientation direction X4, but is inconsistent with the polarization direction X5 of the polarizer, i.e., an angle formed between the polarization direction X5 and the first direction X1 is unequal to an angle formed between the polarization direction X5 and the second direction X2, so that a polarization angle of lights through the odd row of pixels on the array substrate is unequal to a polarization angle of lights through the even row of pixels on the array substrate; on the other hand, if the rubbing orientation direction is deviated in rubbing, the rubbing orientation direction is inconsistent with the direction X3 of angle bisector of the angle α, so that the initial deflection angle of the liquid crystal molecules above the odd rows of pixel electrodes is unequal to the initial deflection angle of the liquid crystal molecules above the even rows of pixel electrodes, on the array substrate. As such, during operation of the liquid crystal display device, when the odd rows of pixel electrodes in the liquid crystal display device correspond to low (or high) luminance, the even rows of pixel electrodes in the liquid crystal display device correspond to high (or low) luminance, i.e. the luminance corresponding to the odd rows of pixel electrodes in the liquid crystal display device is different from the luminance corresponding to the even rows of pixel electrodes in the liquid crystal display device, thereby generating transverse striations in the liquid crystal display device.

Based on the above description, embodiments of the disclosure provide the following technical solutions.

Figure 1B:
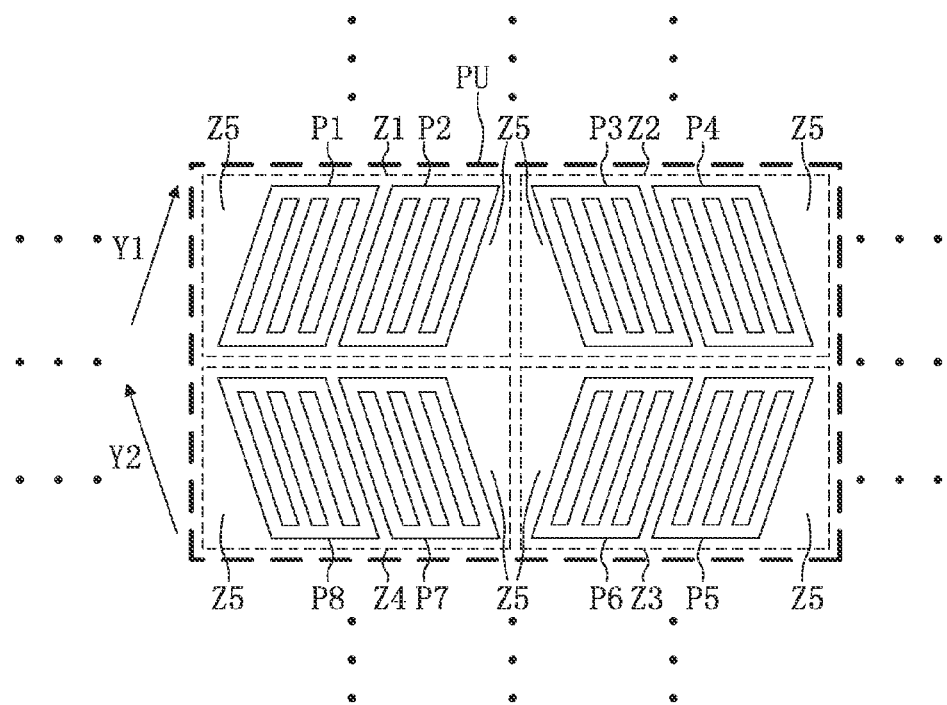
FIG. 1B is a schematic diagram of the structure of an array substrate, according to some embodiments of the disclosure.

FIG. 1B is a schematic diagram showing the structure of an array substrate according to embodiments of the disclosure. Referring to FIG. 1B, the array substrate includes a plurality of pixel units PU each including a 2×2 sub-pixel area matrix, with the 2×2 sub-pixel area matrix including a first sub-pixel area Z1, a second sub-pixel area Z2, a third sub-pixel area Z3, and a fourth sub-pixel area Z4 arranged in sequence; each of the sub-pixel areas includes at least two sub-pixel electrodes each including a strip electrode; the strip electrode of at least one of the sub-pixel electrodes from each of the first sub-pixel area Z1 and the third sub-pixel Z3 is parallel to a first direction Y1; the strip electrode of at least one of the sub-pixel electrodes from each of the second sub-pixel area Z2 and the fourth sub-pixel Z4 is parallel to a second direction Y2; the first direction Y1 intersects with the second direction Y2 to form an angle larger than 0° and smaller than or equal to 90° between the first direction Y1 and the second direction Y2, for example in FIG. 1B, the angle formed between the first direction Y1 and the second direction Y2 is larger than 0° and smaller than 90°; where, a first area Z5 is defined by the sub-pixel electrodes including the strip electrodes parallel to the first direction Y1 and the sub-pixel electrodes including the strip electrodes parallel to the second direction Y2, and is provided with a sub-pixel switch (not shown).

In FIG. 1B, the first sub-pixel area Z1, the second sub-pixel area Z2, the third sub-pixel area Z3 and the fourth sub-pixel area Z4 in the pixel unit PU are arranged clockwise in sequence, and each of the sub-pixel areas includes two sub-pixel electrodes arranged in a 1×2 matrix. The strip electrode of each sub-pixel electrode from each of the first sub-pixel area Z1 and the third sub-pixel Z3 is parallel to the first direction Y1; and the strip electrode of each sub-pixel electrode from each of the second sub-pixel area Z2 and the fourth sub-pixel Z4 is parallel to the second direction Y2. The pixel unit PU includes a first sub-pixel electrode P1, a second sub-pixel electrode P2, a third sub-pixel electrode P3, a fourth sub-pixel electrode P4, a fifth sub-pixel electrode P5, a sixth sub-pixel electrode P6, a seventh sub-pixel electrode P7 and an eighth sub-pixel electrode P8 arranged clockwise in sequence, where, the first sub-pixel electrode P1 and the second sub-pixel electrode P2 are located within the first sub-pixel area Z1, the third sub-pixel electrode P3 and the fourth sub-pixel electrode P4 are located within the second sub-pixel area Z2, the fifth sub-pixel electrode P5 and the sixth sub-pixel electrode P6 are located within the third sub-pixel area Z3, and the seventh sub-pixel electrode P7 and the eighth sub-pixel electrode P8 are located within the fourth sub-pixel area Z4.

It is noted that FIG. 1B is an example of the array substrate of the present disclosure, and the clockwise or anticlockwise arrangement pattern of the four sub-pixel areas in the pixel unit on the array substrate, the number of the sub-pixel electrodes from each of the sub-pixel areas, the number of the sub-pixel electrodes respectively including strip electrodes parallel to the first direction Y1 and the second direction Y2, etc., are not limited herein.

Since the first sub-pixel area, the second sub-pixel area, the third sub-pixel area and the fourth sub-pixel area are arranged in sequence, the first sub-pixel area and the third sub-pixel area are located at different rows, and the second sub-pixel area and the fourth sub-pixel area are located at different rows. Further, considering that each of the sub-pixel areas includes at least two sub-pixel electrodes each including a strip electrode, the strip electrode of at least one of the sub-pixel electrodes from each of the first sub-pixel area and the third sub-pixel is parallel to a first direction, and the strip electrode of at least one of the sub-pixel electrodes from each of the second sub-pixel area and the fourth sub-pixel is parallel to a second direction, not all the strip electrodes of the sub-pixel electrodes from the same row of sub-pixel electrodes in the pixel unit are parallel to the first direction or the second direction, but a part of the strip electrodes of all the sub-pixel electrodes from the same row of sub-pixel electrodes are parallel to the first direction and the remaining of the strip electrodes of all the sub-pixel electrodes from the same row of sub-pixel electrodes are parallel to the second direction.

If the rubbing orientation direction is deviated in rubbing, the rubbing orientation direction is inconsistent with the direction of angle bisector of the angle between the first direction and the second direction, that is, the initial deflection angle of the liquid crystal molecules above the strip electrodes parallel to the first direction is unequal to the initial deflection angle of the liquid crystal molecules above the strip electrodes parallel to the second direction; on the other hand, if the polarizer is deviated in adhering, the polarization direction of the polarizer is inconsistent with the direction of angle bisector of the angle between the first direction and the second direction, a polarization angle of lights through the strip electrodes parallel to the first direction is unequal to a polarization angle of lights through the strip electrodes parallel to the second direction. For both of the above cases, when the sub-pixel electrode including the strip electrode parallel to the first direction corresponds to high luminance, the sub-pixel electrode including the strip electrode parallel to the second direction corresponds to low luminance. However, according to the arrangement pattern of the strip electrodes in each row of sub-pixel electrodes as provided by the present disclosure, each row of sub-pixel electrodes include both the strip electrodes parallel to the first direction and the strip electrodes parallel to the second direction. If the rubbing orientation direction is deviated in rubbing or the polarizer is deviated in adhering, then high luminance and low luminance corresponding to the sub-pixel electrodes from each row of sub-pixel electrodes alternate, that is, the high luminance and low luminance corresponding to the sub-pixel electrodes from either of the odd and even rows of sub-pixel electrodes on the array substrate alternate, so that no distinct luminance difference is present between the odd and even rows of sub-pixel electrodes. In comparison with the existing arrangement pattern of the strip electrodes which causes a distinct difference between luminance corresponding to the odd row of sub-pixel electrodes and the luminance corresponding to the even row of sub-pixel electrodes when the rubbing orientation direction is deviated in rubbing or the polarizer is deviated in adhering, the technical solutions of the present disclosure can avoid the problem of the transverse striations present in the related art. It is noted that in the technical solutions of the present disclosure, since two adjacent sub-pixel electrodes in the same column have strip electrodes parallel with different directions, the effect that high and low luminance corresponding to the sub-pixel electrodes in the same column alternate is achieved as well, thereby avoiding the vertical striation.

With the above arrangement pattern of the strip electrodes in each row of sub-pixel electrodes, where strip electrodes are parallel to the first direction and strip electrodes are parallel to the second direction, the problem of the transverse striation in the related art is solved. However, considering a blank area, i.e. the first area of the present disclosure, which is defined by the sub-pixel electrodes including the strip electrodes parallel to the first direction and the sub-pixel electrodes including the strip electrodes parallel to the second direction, the transmittance of this blank area is different from the transmittance of the area provided with the sub-pixel electrodes, so that the display effect of the array substrate can be affected. In order to avoid such affection on the display, sub-pixel electrodes and sub-pixel switches are provided in the first area, so that after a color filter substrate is laminated to the array substrate, and a black matrix on the color filter substrate shields the sub-pixel switches provided in the first area, thereby both effectively utilizing the first area and ensuring a good display by the array substrate.

It is noted that the above first area may be defined by the sub-pixel electrodes in the same pixel unit, or may be defined between the sub-pixel electrodes from the adjacent pixel units. In various embodiments, the first area within a pixel unit is defined by the sub-pixel electrodes in the pixel unit, and the first area at an edge of the pixel unit may be considered as being defined by the sub-pixel electrodes in the pixel unit and the sub-pixel electrodes in a pixel unit adjacent to the pixel unit.

With the array substrate according to these embodiments of the disclosure, each row of the sub-pixel electrodes include both strip electrodes parallel to the first direction and strip electrodes parallel to the second direction, if the rubbing orientation is deviated in rubbing or the polarizer is deviated in adhering, the high luminance and low luminance corresponding to sub-pixel electrodes from each row of sub-pixel electrodes on the array substrate alternate, so that no distinct luminance difference is present between the odd and even rows of sub-pixel electrodes, thereby avoiding the problem of the transverse striation.

Figure 1C:
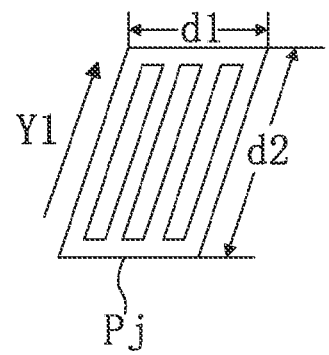
FIG. 1C is a schematic diagram of the structure of a sub-pixel electrode, according to some embodiments of the disclosure.
Figure 1D:
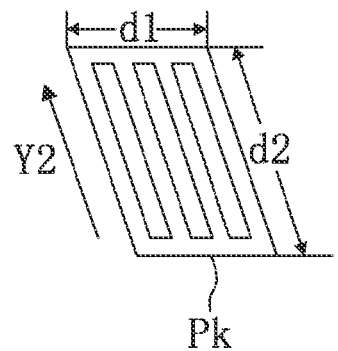
FIG. 1D is a schematic diagram of the structure of another sub-pixel electrode, according to some embodiments of the disclosure.

In an implementation of the above embodiments, all the sub-pixel electrodes from the four sub-pixel areas have the same length; at least one of the sub-pixel electrodes from each of the first sub-pixel area and the third sub-pixel area is parallel to a first direction; and at least one of the sub-pixel electrodes from each of the second sub-pixel area and the fourth sub-pixel area is parallel to a second direction. For example, referring to FIG. 1C, a sub-pixel electrode Pj parallel to the first direction Y1 may be located within the first sub-pixel area or the third sub-pixel area, and the sub-pixel electrode Pj has a width of d1 and a length of d2; referring to FIG. 1D, a sub-pixel electrode Pk parallel to the second direction Y2 may be located within the second sub-pixel area or the fourth sub-pixel area, and the sub-pixel electrode Pk has a width of d1 and a length of d2. It is noted that, on the basis that the strip electrode of at least one of the sub-pixel electrodes from each of the first sub-pixel area and the third sub-pixel area is parallel to the first direction and the strip electrode of at least one of the sub-pixel electrodes from each of the second sub-pixel area and the fourth sub-pixel area is parallel to the second direction, at least one of the sub-pixel electrodes from each of the first sub-pixel area and the third sub-pixel area is further parallel to the first direction, and at least one of the sub-pixel electrodes from each of the second sub-pixel area and the fourth sub-pixel area is parallel to the second direction, so that the first area defined by the sub-pixel electrodes parallel to the first direction and the sub-pixel electrodes parallel to the second direction may have a larger space, thereby making the provision of the sub-pixel switches in the first area easier.

Based on the above principle, the structure of the array substrate, such as the number of the sub-pixel electrodes from each of the sub-pixel areas in the pixel unit, the arrangement pattern of the strip electrodes from each row of sub-pixel electrodes as well as the configuration of the corresponding sub-pixel switches, data lines, gate lines, etc., can be achieved by various implementations, with the problem of the transverse striation avoided when the rubbing orientation direction is deviated in rubbing or the polarizer is deviated in adhering. Embodiments are illustrated below.

In the pixel unit shown in FIG. 1B, the strip electrode of each of the sub-pixel electrodes from each of the first sub-pixel area Z1 and the third sub-pixel Z3 is parallel to the first direction Y1, the strip electrode of each of the sub-pixel electrodes from each of the second sub-pixel area Z2 and the fourth sub-pixel Z4 is parallel to the second direction Y2, and the first areas Z5 may be defined by the second sub-pixel electrode P2, the third sub-pixel electrode P3, the sixth sub-pixel electrode P6 and the seventh sub-pixel electrode P7 in the pixel unit, further first areas Z5 may also be defined by the first sub-pixel electrode P1 and the corresponding sub-pixel electrode in a pixel unit adjacent to the pixel unit including the first sub-pixel electrode P1, defined by the fourth sub-pixel electrode P4 and the corresponding sub-pixel electrode in a pixel unit adjacent to the pixel unit including the fourth sub-pixel electrode P4, defined by the the fifth sub-pixel electrode P5 and the corresponding sub-pixel electrode in a pixel unit adjacent to the pixel unit including the fifth sub-pixel electrode P5, and defined by the eighth sub-pixel electrode P8 and the corresponding sub-pixel electrode in a pixel unit adjacent to the pixel unit including the eighth sub-pixel electrode P8. Each of the sub-pixel electrodes corresponds to one of the first areas Z5, so that the corresponding first area Z5 may be provided with a sub-pixel switch for controlling the corresponding sub-pixel electrode. With such pixel units, the number of the sub-pixel electrodes including the strip electrode parallel to the first direction Y1 is equal to the number of the sub-pixel electrodes including the strip electrode parallel to the second direction Y2 in the same row of sub-pixel electrodes. If the rubbing orientation direction is deviated in rubbing or the polarizer is deviated in adhering, then the high luminance and the low luminance corresponding to the sub-pixel electrodes from the same row of sub-pixel electrodes is distributed in an even alternative way. Further, strip electrodes in the two adjacent sub-pixel electrodes from the same column are parallel with different directions, so that the high luminance and low luminance corresponding to sub-pixel electrodes in the same column alternate, thereby avoiding the problem of the vertical striation. Therefore, the luminance corresponding to sub-pixel electrodes from each row of sub-pixel electrodes on the array substrate is evenly distributed, thereby properly avoiding the transverse striation in the related art.

In some embodiments of the disclosure, it is possible that the strip electrode of one of sub-pixel electrodes from each of the first sub-pixel area Z1 and the third sub-pixel area Z3 is parallel to the first direction Y1, and likewise, the strip electrode of one of the sub-pixel electrodes from each of the second sub-pixel area Z2 and the fourth sub-pixel area Z4 is parallel to the second direction Y2. For example, referring to FIG. 2A, the strip electrodes of the first sub-pixel electrode P1 and the sixth sub-pixel electrode P6 are parallel to the first direction Y1, and the strip electrodes of the third sub-pixel electrode P3 and the eighth sub-pixel electrode P8 are parallel to the second direction Y2. Further, the strip electrodes of the second sub-pixel electrode P2 and the fifth sub-pixel electrode P5 are parallel to the second direction Y2, and the strip electrodes of the fourth sub-pixel electrode P4 and the seventh sub-pixel electrode P7 are parallel to the first direction Y1. Also, referring to FIG. 2B, the second sub-pixel electrode P2 and the fifth sub-pixel electrode P5 have the strip electrodes parallel to the first direction Y1, the fourth sub-pixel electrode P4 and the seventh sub-pixel electrode P7 have the strip electrodes parallel to the second direction Y2, the first sub-pixel electrode P1 and the sixth sub-pixel electrode P6 have the strip electrodes parallel to the second direction Y2, and the third sub-pixel electrode P3 and the eighth sub-pixel electrode P8 have the strip electrodes parallel to the first direction Y1.

Figure 2A:
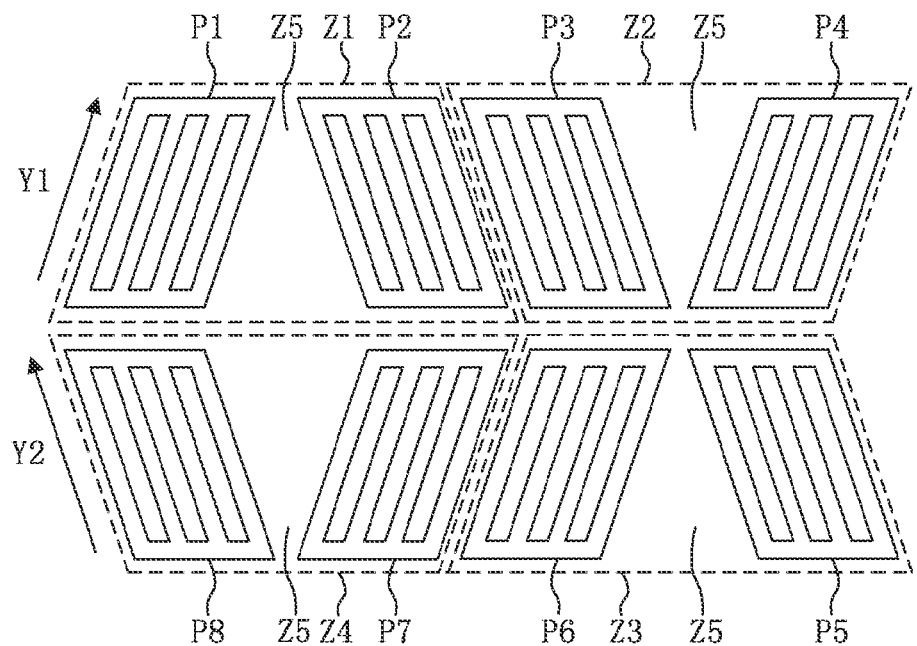
FIG. 2A is a schematic diagram of the structure of a pixel unit, according to some embodiments of the disclosure.
Figure 2B:
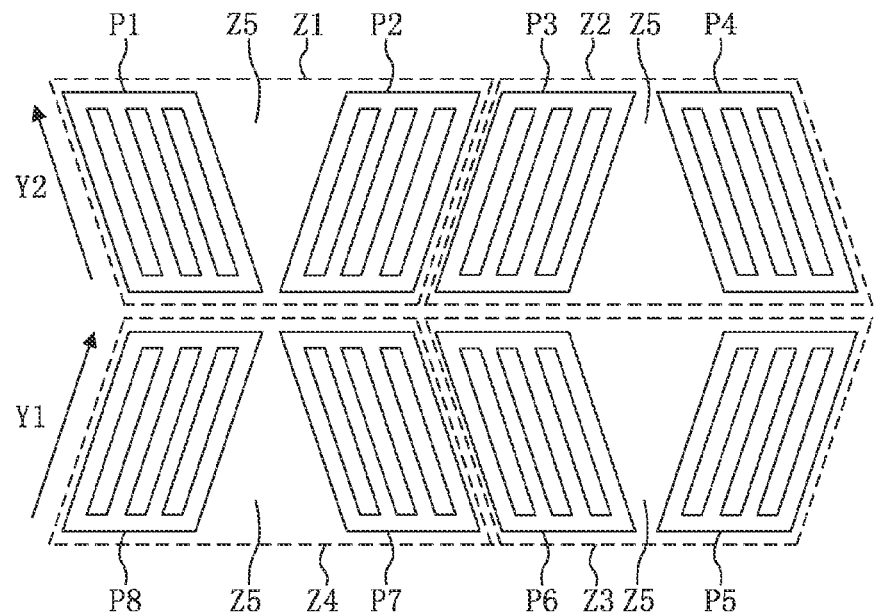
FIG. 2B is a schematic diagram of the structure of another pixel unit, according to some embodiments of the disclosure.

It is noted that the description with respect to the first area Z5 shown in FIGS. 2A and 2B can refer to the related description with respect to the first area Z5 shown in FIG. 1B, and is not discussed repeatedly herein.

In some embodiments, a pixel unit on the array substrate is such that each of the four sub-pixel areas includes three sub-pixel electrodes arranged in a 1×3 sub-pixel electrode matrix. At least one of the sub-pixel electrodes from each of the first sub-pixel area and the third sub-pixel has a strip electrode parallel to the first direction; and at least one of the sub-pixel electrodes from each of the second sub-pixel area and the fourth sub-pixel has a strip electrode parallel to the second direction.

Figure 3A:
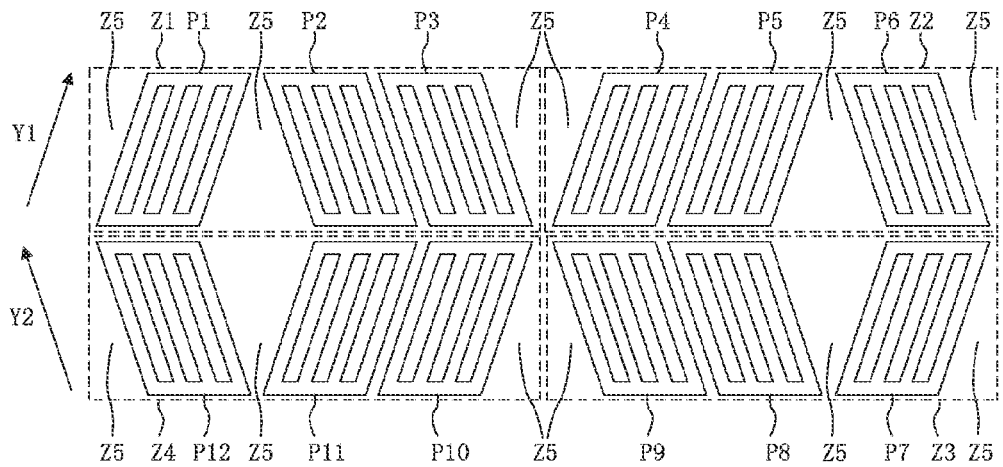
FIG. 3A is a schematic diagram of the structure of a pixel unit, according to some embodiments of the disclosure.

FIG. 3A is a schematic diagram showing the structure of a pixel unit according to some embodiments of the present disclosure. Referring to FIG. 3A, in the pixel unit, one of the sub-pixel electrodes from each of the first sub-pixel area Z1 and the third sub-pixel Z3 has a strip electrode parallel to the first direction Y1; and one of the sub-pixel electrodes from each of the second sub-pixel area Z2 and the fourth sub-pixel Z4 has a strip electrode parallel to the second direction Y2.

Further, referring to FIG. 3A, the pixel unit includes a first sub-pixel electrode P1, a second sub-pixel electrode P2, a third sub-pixel electrode P3, a fourth sub-pixel electrode P4, a fifth sub-pixel electrode P5, a sixth sub-pixel electrode P6, a seventh sub-pixel electrode P7, an eighth sub-pixel electrode P8, a ninth sub-pixel electrode P9, a tenth sub-pixel electrode P10, an eleventh sub-pixel electrode P11 and a twelfth sub-pixel electrode P12 arranged clockwise in sequence, where the first sub-pixel electrode P1, the second sub-pixel electrode P2 and the third sub-pixel electrode P3 are located within the first sub-pixel area Z1, the fourth sub-pixel electrode P4, the fifth sub-pixel electrode P5 and the sixth sub-pixel electrode P6 are located within the second sub-pixel area Z2, the seventh sub-pixel electrode P7, the eighth sub-pixel electrode P8 and the ninth sub-pixel electrode P9 are located within the third sub-pixel area Z3, and the tenth sub-pixel electrode P10, the eleventh sub-pixel electrode P11 and the twelfth sub-pixel electrode P12 are located within the fourth sub-pixel area Z4. The strip electrode of each of the first sub-pixel electrode P1, the fourth sub-pixel electrode P4, the fifth sub-pixel electrode P5, the seventh sub-pixel electrode P7, the tenth sub-pixel electrode P10 and the eleventh sub-pixel electrode P11 is parallel to the first direction Y1, and the strip electrode of each of the second sub-pixel electrode P2, the third sub-pixel electrode P3, the sixth sub-pixel electrode P6, the eighth sub-pixel electrode P8, the ninth sub-pixel electrode P9 and the twelfth sub-pixel electrode P12 is parallel to the second direction Y2.

Additionally, in FIG. 3A, the first area Z5 may be defined by the first sub-pixel electrode P1, the second sub-pixel electrode P2, the eleventh sub-pixel electrode P11 and the twelfth sub-pixel electrode P12. Also, the first areas Z5 may be defined by the fifth sub-pixel electrode P5, the sixth sub-pixel electrode P6, the seventh sub-pixel electrode P7 and the eighth sub-pixel electrode P8, and the first areas Z5 may be defined by the third sub-pixel electrode P3 and the fourth sub-pixel electrode P4, and the first areas Z5 may be defined by the ninth sub-pixel electrode P9 and the tenth sub-pixel electrode P10, and the first areas Z5 may be defined by the first sub-pixel electrode P1 and the corresponding sub-pixel electrode in a pixel unit adjacent to the pixel unit including the first sub-pixel electrode P1, and the first areas Z5 may be defined by the sixth sub-pixel electrode P6 and the corresponding sub-pixel electrode in a pixel unit adjacent to the pixel unit including the sixth sub-pixel electrode P6, and the first areas Z5 may be defined by the seventh sub-pixel electrode P7 and the corresponding sub-pixel electrode in a pixel unit adjacent to the pixel unit including the seventh sub-pixel electrode P7, and the first areas Z5 may be defined by the twelfth sub-pixel electrode P12 and the corresponding sub-pixel electrode in a pixel unit adjacent to the pixel unit including the twelfth sub-pixel electrode P12. Each of the sub-pixel electrodes corresponds to one of the first areas Z5, so that the corresponding first area Z5 may be provided with a sub-pixel switch for controlling the corresponding sub-pixel electrode.

Figure 3B:
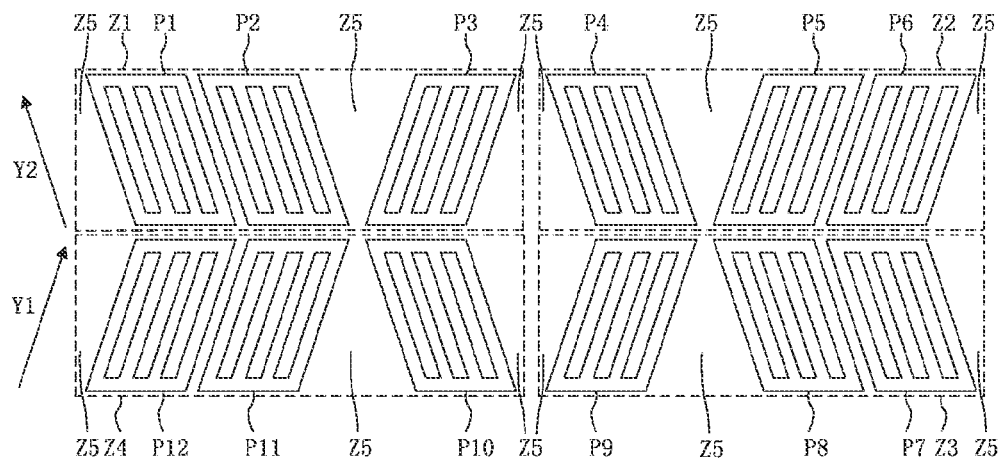
FIG. 3B is a schematic diagram of the structure of another pixel unit, according to some embodiments of the disclosure.

In some embodiments, referring to FIG. 3B, the strip electrode of each of the third sub-pixel electrode P3 and the ninth sub-pixel electrode P9 is parallel to the first direction Y1, and the strip electrode of each of the fourth sub-pixel electrode P4 and the tenth sub-pixel electrode P10 is parallel to the second direction Y2, also, the strip electrode of each of the first sub-pixel electrode P1, the second sub-pixel electrode P2, the seventh sub-pixel electrode P7 and the eighth sub-pixel electrode P8 is parallel to the second direction Y2, and the strip electrode of each of the fifth sub-pixel electrode P5, the sixth sub-pixel electrode P6, the eleventh sub-pixel electrode P11 and the twelfth sub-pixel electrode P12 is parallel to the first direction Y1.

Additionally, it is also possible that the strip electrodes of two sub-pixel electrodes from each of the first sub-pixel area Z1 and the third sub-pixel area Z3 are parallel to the first direction Y1, and the strip electrodes of two sub-pixel electrodes from each of the second sub-pixel area Z2 and the fourth sub-pixel area Z4 are parallel to the second direction Y2. For example, referring to FIG. 3C, the strip electrodes of both the first sub-pixel electrode P1 and the second sub-pixel electrode P2 and the strip electrodes of both the seventh sub-pixel electrode P7 and the eighth sub-pixel electrode P8 are parallel to the first direction Y1, the strip electrodes of both the fifth sub-pixel electrode P5 and the sixth sub-pixel electrode P6 and the strip electrodes of both the eleventh sub-pixel electrode P11 and the twelfth sub-pixel electrode P12 are parallel to the second direction Y2, the strip electrode of each of the fourth sub-pixel electrode P4 and the tenth sub-pixel electrode P10 is parallel to the first direction Y1, and the strip electrode of each of the third sub-pixel electrode P3 and the ninth sub-pixel electrode P9 is parallel to the second direction Y2. Alternatively, referring to FIG. 3D, the strip electrodes of both the second sub-pixel electrode P2 and the third sub-pixel electrode P3 and the stripe electrodes of both the eighth sub-pixel electrode P8 and the ninth sub-pixel electrode P9 are parallel to the first direction Y1, the strip electrodes of both the fourth sub-pixel electrode P4 and the fifth sub-pixel electrode P5 and the strip electrodes of both the tenth sub-pixel electrode P10 and the eleventh sub-pixel electrode P11 are parallel to the second direction Y2, the strip electrode of each of the sixth sub-pixel electrode P6 and the twelfth sub-pixel electrode P12 is parallel to the first direction Y1, and the strip electrode of each of the first sub-pixel electrode P1 and the seventh sub-pixel electrode P7 is parallel to the second direction Y2.

Figure 3C:
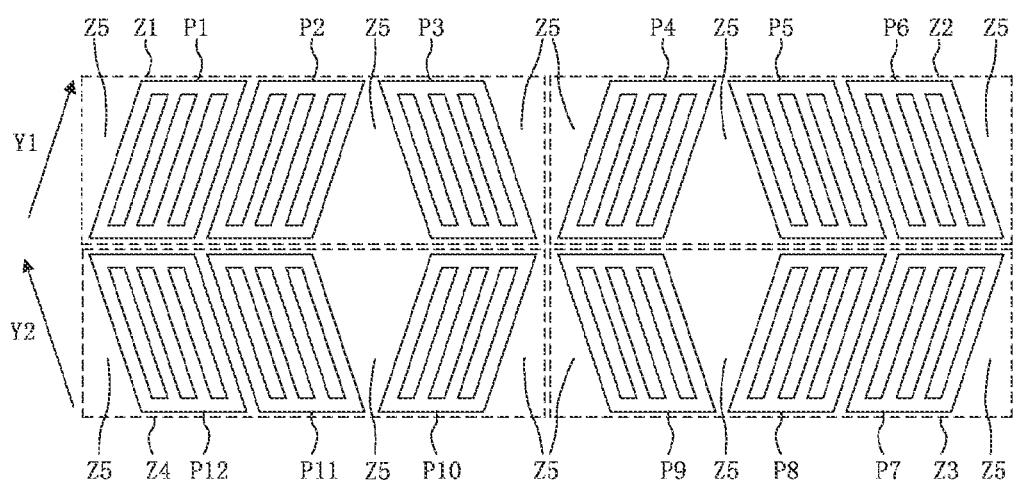
FIG. 3C is a schematic diagram of the structure of a further pixel unit, according to some embodiments of the disclosure.
Figure 3D:
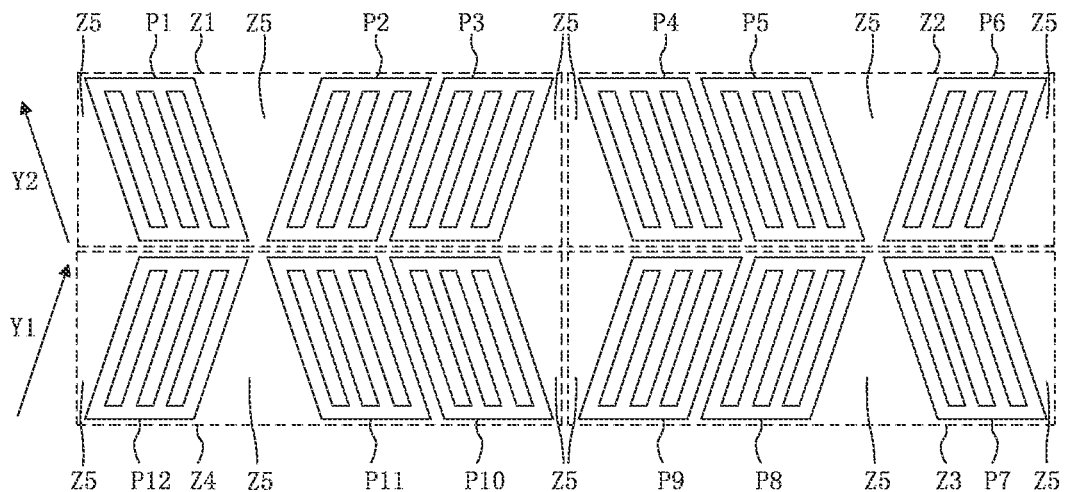
FIG. 3D is a schematic diagram of the structure of a yet further pixel unit, according to some embodiments of the disclosure.

It is noted that the description with respect to the first area Z5 shown in FIGS. 3B to 3D can refer to the related description with respect to the first area Z5 shown in FIG. 3A, and is not discussed repeatedly herein.

In the above embodiments, the sub-pixel electrodes in the pixel unit may be red sub-pixel electrodes, green sub-pixel electrodes, blue sub-pixel electrodes or white sub-pixel electrodes.

In an implementation of the above embodiments, the sub-pixel electrodes in the same column from the first sub-pixel area and the fourth sub-pixel area are of different colors, and the sub-pixel electrodes in the same column from the second sub-pixel area and the third sub-pixel area are of different colors. For example, for the pixel unit shown in FIG. 1B, the first to eighth sub-pixel electrodes (P1 to P8) are embodied as a red sub-pixel electrode, a green sub-pixel electrode, a blue sub-pixel electrode, a white sub-pixel electrode, a green sub-pixel electrode, a red sub-pixel electrode, a white sub-pixel electrode and a blue sub-pixel electrode in sequence. With such configuration of the sub-pixel electrodes, the strip electrodes of the same color in two adjacent rows of sub-pixel electrodes may be parallel with the same direction, thereby effectively avoiding the transverse striation in the related art.

Next, embodiments are described to illustrate the configuration of the sub-pixel switches, the data lines and the gate lines in the pixel unit.

Figure 4A:
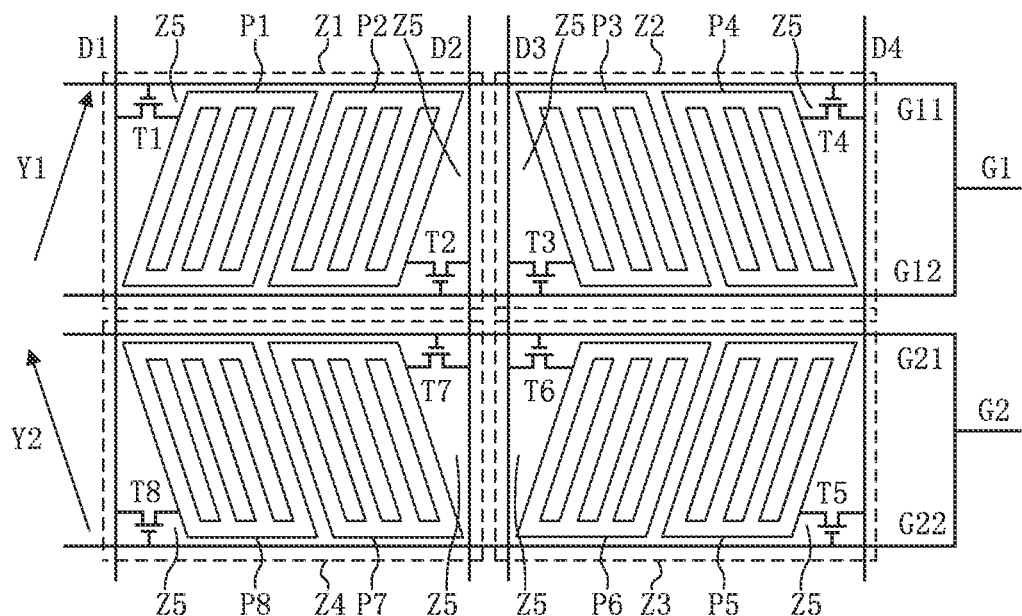
FIG. 4A is a schematic diagram of the structure of a pixel unit, according to some embodiments of the disclosure.

FIG. 4A is a schematic diagram showing the structure of a pixel unit according to some embodiments of the disclosure. It is noted that FIG. 4A shows the configuration of the data lines, the gate lines and the sub-pixel switches in the pixel unit as shown in FIG. 1B. Referring to FIG. 4A, the pixel unit further includes: eight sub-pixel switches (T1 to T8) configured for controlling the eight sub-pixel electrodes (P1 to P8), with each of the eight sub-pixel switches (T1 to T8) being provided within a corresponding one of the first areas Z5; two gate lines including a first gate line G1 and a second gate line G2; and four data lines intersecting with the gate lines (G1 and G2), and including a first data line D1, a second data line D2, a third data line D3 and a fourth data line D4; where the first gate line G1 is electrically connected with the first sub-pixel electrode P1, the second sub-pixel electrode P2, the third sub-pixel electrode P3 and the fourth sub-pixel electrode P4; the second gate line G2 is electrically connected with the fifth sub-pixel electrode P5, the sixth sub-pixel electrode P6, the seventh sub-pixel electrode P7 and the eighth sub-pixel electrode P8; the first data line D1 is electrically connected with the first sub-pixel electrode P1 and the eighth sub-pixel electrode P8, the second data line D2 is electrically connected with the second sub-pixel electrode P2 and the seventh sub-pixel electrode P7, the third data line D3 is electrically connected with the third sub-pixel electrode P3 and the sixth sub-pixel electrode P6, and the fourth data line D4 is electrically connected with fourth sub-pixel electrode P4 and the fifth sub-pixel electrode P5; where, each of the gate lines (G1 and G2) and each of the data lines (D1 to D4) are electrically connected with the sub-pixel switch corresponding to each of the sub-pixel electrodes.

As shown in FIG. 4A, in the pixel unit, a gate line that is electrically connected with the sub-pixel electrodes in the same row is used for driving in a double-lines-driving manner. The first gate line G1 includes two branch lines parallel to each other in the pixel unit, with the two branch lines of the first gate line G1 including a first branch line G11 and a second branch line G12, where, the first sub-pixel area Z1 and the second sub-pixel Z2 are located between the first branch line G11 and the second branch line G12; and the second gate line G2 includes two branch lines parallel to each other in the pixel unit, with the two branch lines of the second gate line G2 including a third branch line G21 and a fourth branch line G22, where, the third sub-pixel area Z3 and the fourth sub-pixel area Z4 are located between the third branch line G21 and the fourth branch line G22.

It is noted that the first branch line G11 and the second branch line G12 of the first gate line G1 can be electrically connected together via a branch line parallel to the data line or other wiring so that the first branch line G11 and the second branch line G12 can simultaneously drive each of the sub-pixel electrodes from each of the first sub-pixel area Z1 and the second sub-pixel area Z2. Also, the third branch line G21 and the fourth branch line G22 of the second gate line G2 can be electrically connected together via a branch line parallel to the data line or other wiring so that the third branch line G21 and the fourth branch line G22 can simultaneously drive each of the sub-pixel electrodes from each of the third sub-pixel area Z3 and the fourth sub-pixel area Z4.

As shown in FIG. 4A, the first data line D1 is provided at the sides of both the first sub-pixel area Z1 and the fourth sub-pixel area Z4 away from the second sub-pixel area Z2, the second data line D2 is provided at the sides of both the first sub-pixel area Z1 and the fourth sub-pixel area Z4 close to the second sub-pixel area Z2, the third data line D3 is provided at the sides of both the second sub-pixel area Z2 and the third sub-pixel area Z3 close to the first sub-pixel area Z1, and the fourth data line D4 is provided at the sides of both the second sub-pixel area Z2 and the third sub-pixel area Z3 away from the first sub-pixel area Z1.

As shown in FIG. 4A, a gate electrode of the first sub-pixel switch T1 is electrically connected with the first branch line G11 of the first gate line G1, a source electrode of the first sub-pixel switch T1 is electrically connected with the first data line D1, and a drain electrode of the first sub-pixel switch T1 is electrically connected with the first sub-pixel electrode P1; a gate electrode of the second sub-pixel switch T2 is electrically connected with the second branch line G12 of the first gate line G1, a source electrode of the second sub-pixel switch T2 is electrically connected with the second data line D2, and a drain electrode of the second sub-pixel switch T2 is electrically connected with the second sub-pixel electrode P2; a gate electrode of the third sub-pixel switch T3 is electrically connected with the second branch line G12 of the first gate line G1, a source electrode of the third sub-pixel switch T3 is electrically connected with the third data line D3, and a drain electrode of the third sub-pixel switch T3 is electrically connected with the third sub-pixel electrode P3; a gate electrode of the fourth sub-pixel switch T4 is electrically connected with the first branch line G11 of the first gate line G1, a source electrode of the fourth sub-pixel switch T4 is electrically connected with the fourth data line D4, and a drain electrode of the fourth sub-pixel switch T4 is electrically connected with the fourth sub-pixel electrode P4; a gate electrode of the fifth sub-pixel switch T5 is electrically connected with the fourth branch line G22 of the second gate line G2, a source electrode of the fifth sub-pixel switch T5 is electrically connected with the fourth data line D4, and a drain electrode of the fifth sub-pixel switch T5 is electrically connected with the fifth sub-pixel electrode P5; a gate electrode of the sixth sub-pixel switch T6 is electrically connected with the third branch line G21 of the second gate line G2, a source electrode of the sixth sub-pixel switch T6 is electrically connected with the third data line D3, and a drain electrode of the sixth sub-pixel switch T6 is electrically connected with the sixth sub-pixel electrode P6; a gate electrode of the seventh sub-pixel switch T7 is electrically connected with the third branch line G21 of the second gate line G2, a source electrode of the seventh sub-pixel switch T7 is electrically connected with the second data line D2, and a drain electrode of the seventh sub-pixel switch T7 is electrically connected with the seventh sub-pixel electrode P7; a gate electrode of the eighth sub-pixel switch T8 is electrically connected with the fourth branch line G22 of the second gate line G2, a source electrode of the eighth sub-pixel switch T8 is electrically connected with the first data line D1, and a drain electrode of the eighth sub-pixel switch T8 is electrically connected with the eighth sub-pixel electrode P8.

Figure 4B:
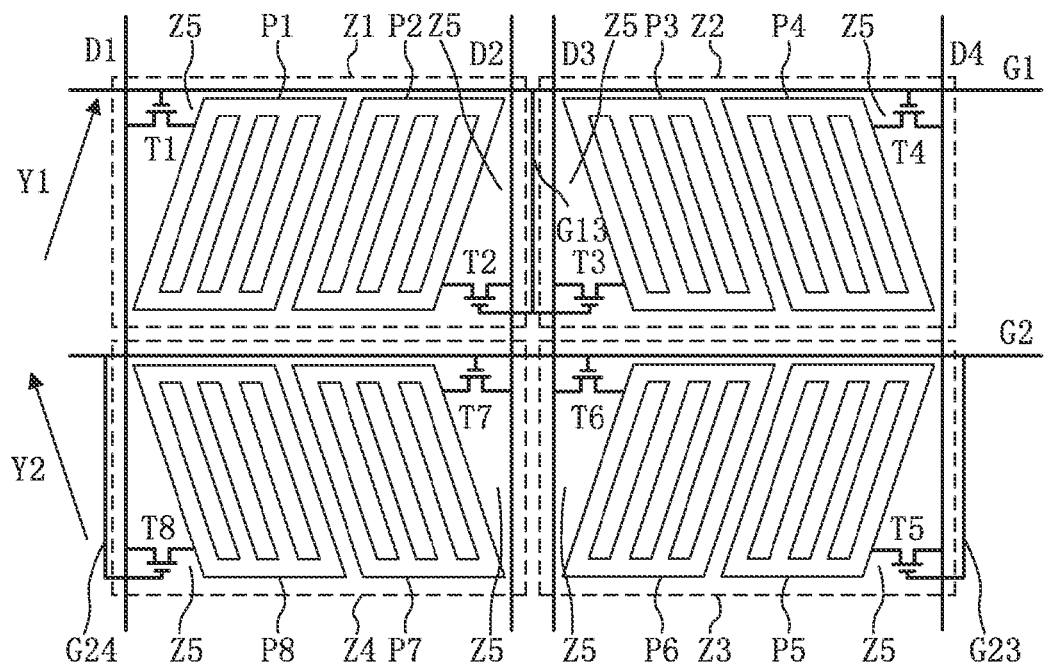
FIG. 4B is a schematic diagram of the structure of another pixel unit, according to some embodiments of the disclosure.

In some embodiments, the gate line electrically connected with the sub-pixel electrodes in the same row may be also used for driving in a single-line-driving manner. Referring to FIG. 4B, the first gate line G1 includes a branch line G13 parallel to the data line in the first area Z5 so that the first gate line G1 is electrically connected with the second sub-pixel electrode P2 and the third sub-pixel electrode P3 via the branch line G13; the second gate line G2 includes a branch line G23 parallel to the data line at the side of the third sub-pixel area Z3 away from the fourth sub-pixel area Z4 so that the second gate line G2 is electrically connected with the fifth sub-pixel electrode P5 via the branch line G23, further the second gate line G2 includes a branch line G24 parallel to the data line at the side of the fourth sub-pixel area Z4 away from the third sub-pixel area Z3 so that the second gate line G2 is electrically connected with the eighth sub-pixel electrode P8 via the branch line G24.

Figure 4C:
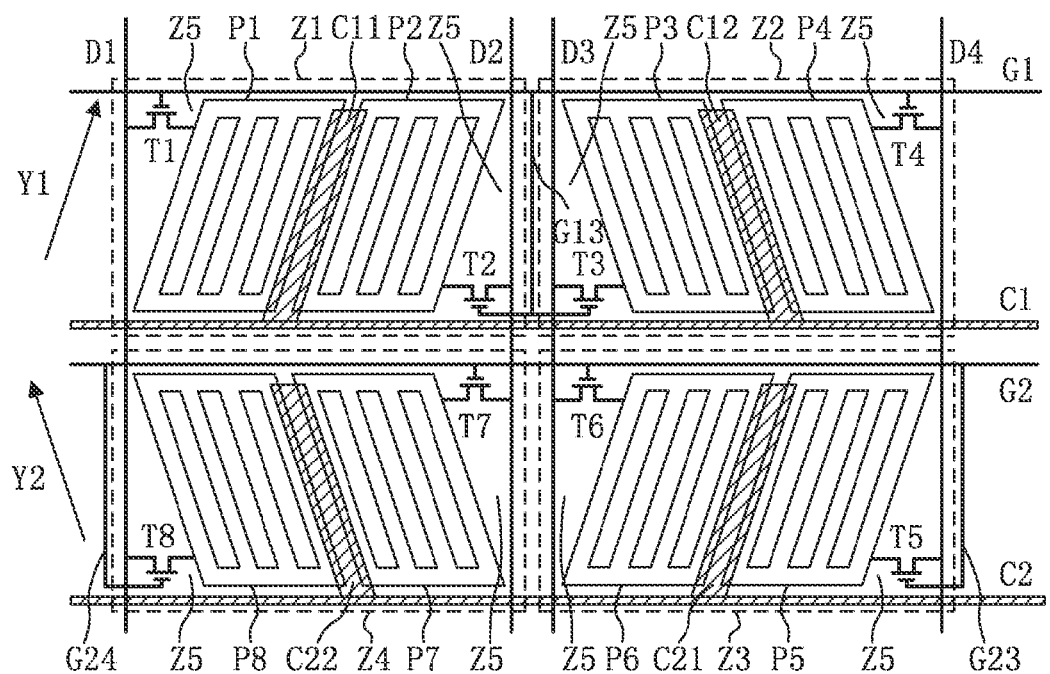
FIG. 4C is a schematic diagram of the structure of the pixel unit shown in FIG. 4B provided with common electrode lines, according to some embodiments of the disclosure.

On the basis that the pixel unit on the array substrate shown in FIG. 4B is provided with the data lines, the gate lines and the pixel switches, referring to FIG. 4C, the pixel unit further includes: a first common electrode line C1 and a second common electrode line C2, where, the first common electrode line C1 is parallel to the first gate line G1, and the first sub-pixel area Z1 and the second sub-pixel area Z2 are located between the first common electrode line C1 and the first gate line G1; the second common electrode line C2 is parallel to the second gate line G2, and the third sub-pixel area Z3 and the fourth sub-pixel area Z4 are located between the second common electrode line C2 and the second gate line G2; the first common electrode line C1 includes a branch line C11 between the first sub-pixel electrode P1 and the second sub-pixel electrode P2, the first common electrode line C1 includes a branch line C12 between the third sub-pixel electrode P3 and the fourth sub-pixel electrode P4, the second common electrode line C2 includes a branch line C21 between the fifth sub-pixel electrode P5 and the sixth sub-pixel electrode P6, and the second electrode line C2 includes a branch line C22 between the seventh sub-pixel electrode P7 and the eighth sub-pixel electrode P8. With such arrangement of the branch lines of the common electrode line between the above sub-pixel electrodes, an overlapping portion is present between the branch lines of the common electrode line and the corresponding sub-pixel electrodes, so that a storage capacitor is formed by the branch lines of the common electrode line and the sub-pixel electrodes corresponding to the overlapping portion, thus alleviating flicker of the displayed image by the storage capacitor in displaying.

Figure 5A:
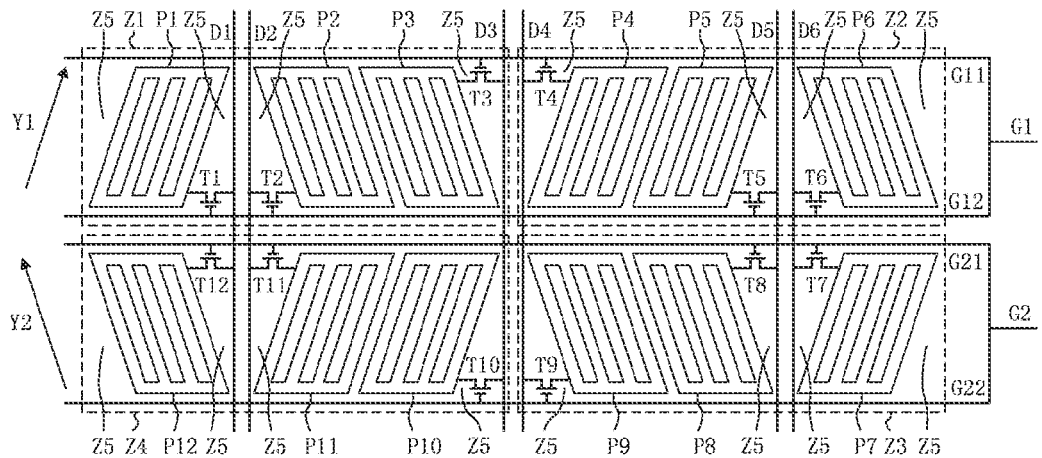
FIG. 5A is a schematic diagram of the structure of a pixel unit, according to some embodiments of the disclosure.

FIG. 5A is a schematic diagram showing the structure of a pixel unit according to some embodiments of the disclosure. It is noted that FIG. 5A shows the configuration of the data lines, the gate lines and the sub-pixel switches in the pixel unit as shown in FIG. 3A. Referring to FIG. 5A, the pixel unit further includes: twelve sub-pixel switches (T1 to T12) configured for controlling the twelve sub-pixel electrodes (P1 to P12), with each of the twelve sub-pixel switches (T1 to T12) being provided within corresponding one of the first areas Z5; two gate lines including a first gate line G1 and a second gate line G2; and six data lines intersecting with the gate lines (G1 and G2), and including a first data line D1, a second data line D2, a third data line D3, a fourth data line D4, a fifth data line D5 and a sixth data line D6; where the first gate line G1 is electrically connected with the first sub-pixel electrode P1, the second sub-pixel electrode P2, the third sub-pixel electrode P3, the fourth sub-pixel electrode P4, the fifth sub-pixel electrode P5 and the sixth sub-pixel electrode P6; the second gate line G2 is electrically connected with the seventh sub-pixel electrode P7, the eighth sub-pixel electrode P8, the ninth sub-pixel electrode P9, the tenth sub-pixel electrode P10, the eleventh sub-pixel electrode P11 and the twelfth sub-pixel electrode P12; the first data line D1 is electrically connected with the first sub-pixel electrode P1 and the twelfth sub-pixel electrode P12, the second data line D2 is electrically connected with the second sub-pixel electrode P2 and the eleventh sub-pixel electrode P11, the third data line D3 is electrically connected with the third sub-pixel electrode P3 and the tenth sub-pixel electrode P10, the fourth data line D4 is electrically connected with fourth sub-pixel electrode P4 and the ninth sub-pixel electrode P9, the fifth data line D5 is electrically connected with the fifth sub-pixel electrode P5 and the eighth sub-pixel electrode P8, and the sixth data line D6 is electrically connected with sixth sub-pixel electrode P6 and the seventh sub-pixel electrode P7; where each of the gate lines (G1 and G2) and each of the data lines (D1 to D6) are electrically connected with the sub-pixel switch corresponding to each of the sub-pixel electrode.

As shown in FIG. 5A, in the pixel unit, a gate line electrically connected with the sub-pixel electrodes in the same row is used for driving in a double-lines-driving manner. The first gate line G1 includes two branch lines parallel to each other in the pixel unit, with the two branch lines of the first gate line G1 including a first branch line G11 and a second branch line G12, where, the first sub-pixel area Z1 and the second sub-pixel Z2 are located between the first branch line G11 and the second branch line G12; and the second gate line G2 includes two branch lines parallel to each other in the pixel unit, with the two branch lines of the second gate line G2 including a third branch line G21 and a fourth branch line G22, where, the third sub-pixel area Z3 and the fourth sub-pixel area Z4 are located between the third branch line G21 and the fourth branch line G22.

It is noted that the first branch line G11 and the second branch line G12 of the first gate line G1 can be electrically connected together via a branch line parallel to the data line or other wiring so that the first branch line G11 and the second branch line G12 can simultaneously drive each of the sub-pixel electrodes from each of the first sub-pixel area Z1 and the second sub-pixel area Z2. Also, the third branch line G21 and the fourth branch line G22 of the second gate line G2 can be electrically connected together via a branch line parallel to the data line or other wiring so that the third branch line G21 and the fourth branch line G22 can simultaneously drive each of the sub-pixel electrodes from each of the third sub-pixel area Z3 and the fourth sub-pixel area Z4.

As shown in FIG. 5A, the first data line D1 is provided at the sides of both the first sub-pixel electrode P1 and the twelfth sub-pixel electrode P12 close to the second sub-pixel electrode P2, the second data line D2 is provided at the sides of both the second sub-pixel electrode P2 and the eleventh sub-pixel electrode P11 away from the third sub-pixel electrode P3, the third data line D3 is provided at the sides of both the third sub-pixel electrode P3 and the tenth sub-pixel electrode P10 away from the second sub-pixel electrode P2, the fourth data line D4 is provided at the sides of both the fourth sub-pixel electrode P4 and the ninth sub-pixel electrode P9 away from the fifth sub-pixel electrode P5, the fifth data line D5 is provided at the sides of both the fifth sub-pixel electrode P5 and the eighth sub-pixel electrode P8 away from the fourth sub-pixel electrode P4, and the sixth data line D6 is provided at the sides of both the sixth sub-pixel electrode P6 and the seventh sub-pixel electrode P7 close to the fifth sub-pixel electrode P5.

It is noted that the description with respect to the electrical connection of each of the sub-pixel switches with the data lines, the gate lines and the sub-pixel electrodes shown in FIG. 5A can refer to the related description with respect to those shown in FIG. 4A, and is not discussed repeatedly herein.

Figure 5B:
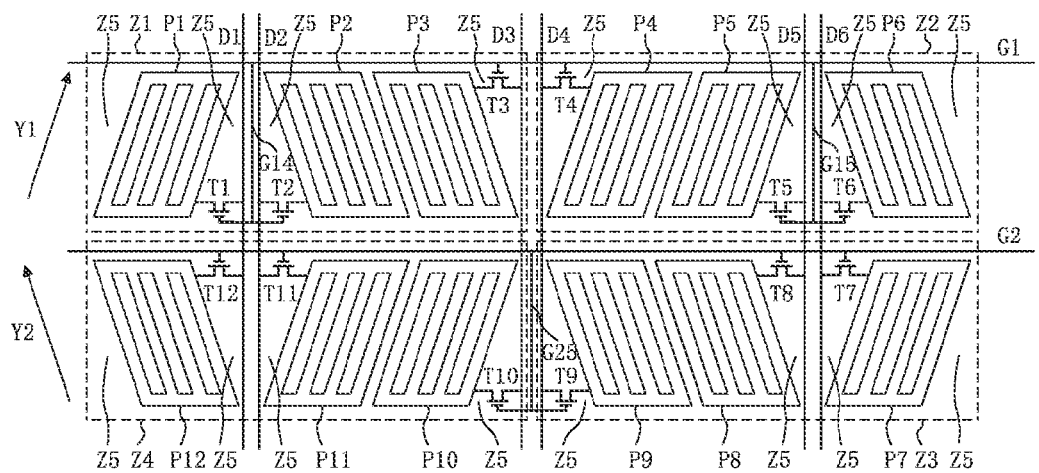
FIG. 5B is a schematic diagram of the structure of another pixel unit, according to some embodiments of the disclosure.

In some embodiments, the gate line electrically connected with the sub-pixel electrodes in the same row may be also used for driving in a single-line-driving manner. Referring to FIG. 5B, the first gate line G1 includes a fifth branch line G14 and a sixth branch line G15 parallel to the data line in the first area Z1 so that the first gate line G1 is electrically connected with the first sub-pixel electrode P1 and the second sub-pixel electrode P2 via the fifth branch line G14, and the first gate line G1 is electrically connected with the fifth sub-pixel electrode P5 and the sixth sub-pixel electrode P6 via the sixth branch line G15; and the second gate line G2 includes a branch line G25 parallel to the data line at the side of the fourth sub-pixel area Z4 close to the third sub-pixel area Z3 so that the second gate line G2 is electrically connected with the ninth sub-pixel electrode P9 and the tenth sub-pixel electrode P10 via the branch line G25.

Figure 5C:
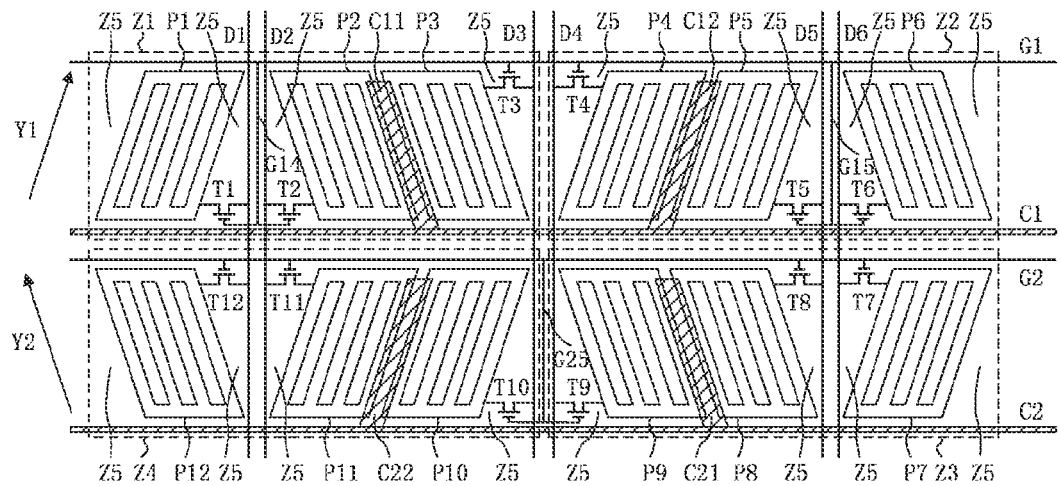
FIG. 5C is a schematic diagram of the structure of the pixel unit shown in FIG. 5B provided with common electrode lines, according to some embodiments of the disclosure.

On the basis that the pixel unit on the array substrate shown in FIG. 5B is provided with the data lines, the gate lines and the pixel switches, referring to FIG. 5C, the pixel unit further includes: a first common electrode line C1 and a second common electrode line C2, where, the first common electrode line C1 is parallel to the first gate line G1, and the first sub-pixel area Z1 and the second sub-pixel area Z2 are located between the first common electrode line C1 and the first gate line G1; the second common electrode line C2 is parallel to the second gate line G2, and the third sub-pixel area Z3 and the fourth sub-pixel area Z4 are located between the second common electrode C2 and the second gate line G2. The first common electrode line C1 includes a branch line C11 between the second sub-pixel electrode P2 and the third sub-pixel electrode P3, the first common electrode line C1 includes a branch line C12 between the fourth sub-pixel electrode P4 and the fifth sub-pixel electrode P5, the second common electrode line C2 includes a branch line C21 between the eighth sub-pixel electrode P8 and the ninth sub-pixel electrode P9, and the second electrode line C2 includes a branch line C22 between the tenth sub-pixel electrode P10 and the eleventh sub-pixel electrode P11. With such arrangement of the branch lines of the common electrode lines between the above sub-pixel electrodes, an overlapping portion is present between the branch lines of the common electrode lines and corresponding sub-pixel electrodes, so that a storage capacitor is formed by the branch lines of the common electrode lines and the sub-pixel electrodes corresponding to the overlapping portion, thus alleviating flicker of the displayed image by the storage capacitor in displaying.

It is noted that each of the sub-pixel switches in the above embodiments can be embodied by a Thin Film Transistor (TFT).

It is further noted that configuration of the data lines, the gate lines, the sub-pixel switches and the common electrode lines in the pixel units in the embodiments described in FIGS. 2A and 2B and the embodiments described in FIGS. 3A and 3B can refer to FIGS. 4A to 4C and FIGS. 5A to 5C and the related description thereof, and is not discussed repeatedly herein.

As above, some embodiments with respect to the first area defined by the sub-pixel electrodes including the strip electrodes parallel to the first direction Y1 and the sub-pixel electrodes including the strip electrodes parallel to the second direction Y2 and the configuration of the first area are described. Next, embodiments are described according to one technique or technology.

Figure 6A:
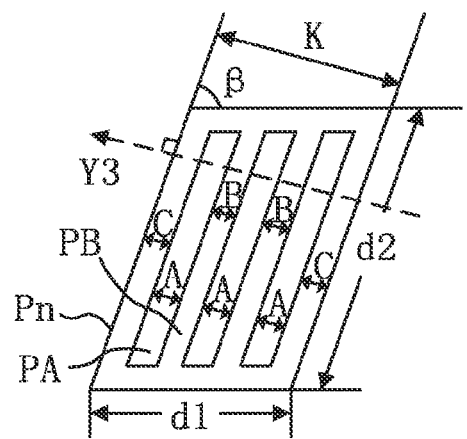
FIG. 6A is a schematic diagram of the structure of a sub-pixel electrode, according to some embodiments of the disclosure.

In the process of designing the sub-pixel electrodes, both a size of a slit in the sub-pixel electrode and a width of the strip electrode between the slits may be limited by the technique. Under a certain technique, if A represents the minimum width of the slit that can be manufactured, B represents the minimum width of the strip electrode, and C represents a necessary distance from the slit at the edge of the sub-pixel electrode to the edge of the sub-pixel electrode, then the width K of the sub-pixel electrode may be represented as $K=2C+n \times A+(n-1) \times B$, where, n represents the number of the slits in the sub-pixel electrode. It is noted that the minimum width A of the slit, the minimum width B of the strip electrode, the necessary distance C and the width K of the sub-pixel electrode each indicate the size along a direction perpendicular to the long side of the sub-pixel electrode. FIG. 6A is a schematic diagram showing the structure of a sub-pixel electrode according to some embodiments of the disclosure. Referring to FIG. 6A, a sub-pixel electrode Pn includes three slits PA having the minimum width A and two strip electrodes PB located between the slits PA and having the minimum width B, and a necessary distance from the slit PA at the edge of the sub-pixel electrode Pn to the edge of the sub-pixel electrode Pn is equal to C, and accordingly, the width K of the sub-pixel electrode may be obtained as $K=2C+3A+2B$, where, A, B, C and K each indicate the size along the direction Y3 (i.e., the direction perpendicular to the long side of the sub-pixel electrode Pn), and K and d1 satisfies a relationship of $K=d1*\sin \beta$.

Figure 6B:
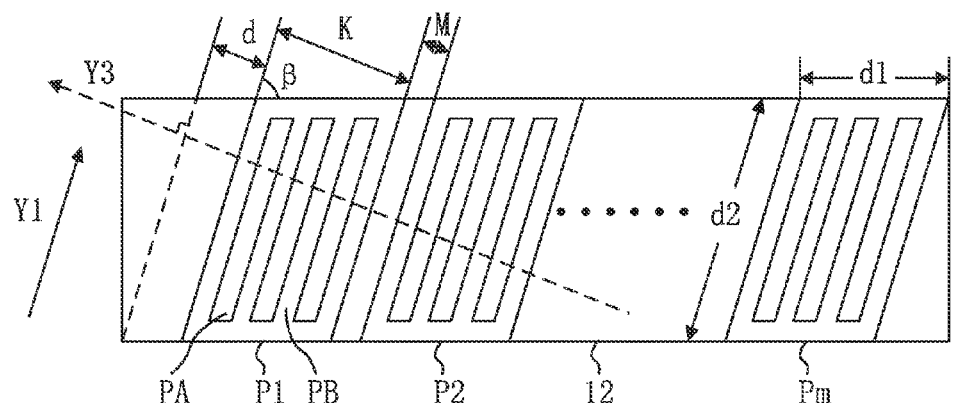
FIG. 6B is a schematic diagram of the structure of an array substrate, according to some embodiments of the disclosure.

FIG. 6B is a schematic diagram showing the structure of an array substrate according to some embodiments of the disclosure. Referring to FIG. 6B, in a row of sub-pixel electrodes provided on an array substrate 12, a strip electrode PB of each of the sub-pixel electrodes P1 to Pm is parallel to the first direction Y1, where m is an integer larger than 1. M represents a distance between two adjacent sub-pixel electrodes, d represents a width of a margin for the row of sub-pixel electrodes, and M and d each indicate the size along the direction Y3, where $d<m*(A+B)$ and $d<(M+K)$ (i.e. $d<M+2C+2A+B$), which indicates that such margin is inadequate to accommodate a sub-pixel electrode (which is determined by the condition $d<M+K$) or to add a new slit in each of the sub-pixel electrodes (which is determined by the condition $d<m*(A+B)$). To overcome this case, the slit of the each of the sub-pixel electrodes is usually widened in the related art, so that the sub-pixel electrodes with the widened slits can just fully occupy the row on the array substrate, thereby eliminating the margin. Although the issue of the margin may be solved in this way, the widened slit of each of the sub-pixel electrodes will cause a serious black domain phenomenon in displaying.

In the above embodiments of the disclosure, because of the presence of the first areas, a space occupied by one row of sub-pixel electrodes in the embodiments of the disclosure is larger than a space occupied by one row of sub-pixel electrodes shown in FIG. 6B in the case that the two rows of sub-pixel electrodes have the same number of sub-pixel electrodes, so that the margin in FIG. 6B is eliminated. It is noted that if the size of the array substrate cannot accommodate one row of the sub-pixel electrodes in the above embodiments of the disclosure, each of the sub-pixel electrodes may be compressed properly. For example, one or more of the minimum width A of the slit in the sub-pixel electrode, the minimum width B of the strip electrode and the necessary distance C from the slit at the edge of the sub-pixel electrode to the edge of the sub-pixel electrode may be reduced properly through compression, so that the array substrate can just accommodate the row of sub-pixel electrodes.

Figure 7A:
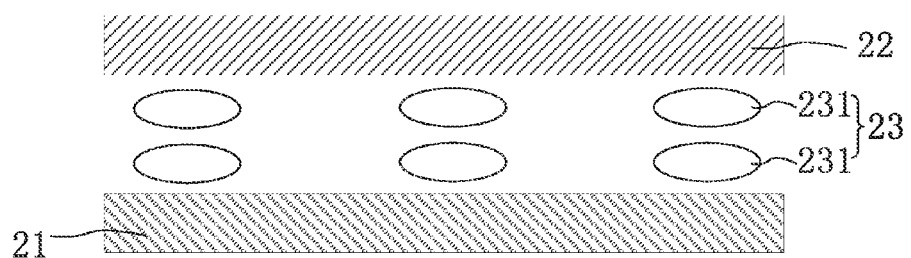
FIG. 7A is a schematic diagram of the structure of a display panel, according to some embodiments of the disclosure.

FIG. 7A is a schematic diagram showing the structure of a display panel according to some embodiments of the disclosure. Referring to FIG. 7A, the display panel includes: a first substrate 21, a second substrate 22 and a liquid crystal layer 23 located between the first substrate 21 and the second substrate 22, where, the liquid crystal layer 23 includes liquid crystal molecules 231. The above second substrate 22 may be a color filter substrate, and the first substrate 21 may be the array substrate according to the above various embodiments.

Figure 7B:
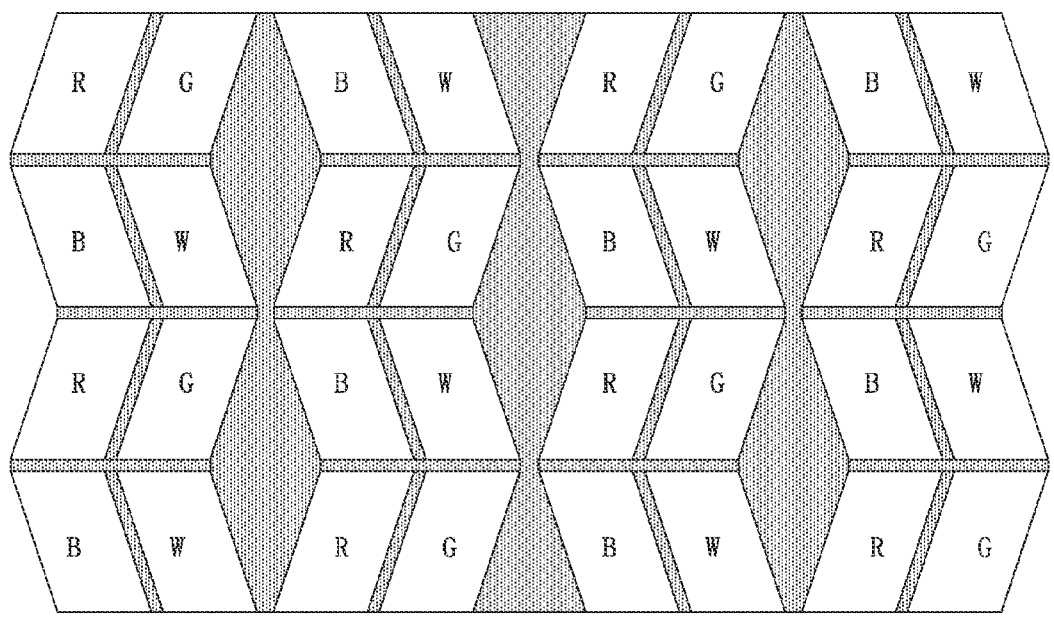
FIG. 7B is a schematic diagram of the structure of a color filter substrate, according to some embodiments of the disclosure.

It is noted that the color filter substrate is disposed opposite to the array substrate. For example, on the array substrate, when the sub-pixel electrodes in the pixel unit are configured as shown in FIG. 1B and the eight sub-pixel electrodes P1 to P8 are embodied as a red sub-pixel electrode, a green sub-pixel electrode, a blue sub-pixel electrode, a white sub-pixel electrode, a green sub-pixel electrode, a red sub-pixel electrode, a white sub-pixel electrode and a blue sub-pixel electrode in sequence, a color filter layer on the color filter substrate is configured as shown in FIG. 7B, where R represents a red color filter, G represents a green color filter, and B represents a blue color filter, and a darken area between the color filters represents a portion shielded by the black matrix in the color filter substrate.

In some embodiments, the above display panel may have a touch sensing function. The touch function may be an electromagnetic touch sensing function, a capacitive touch sensing function or an electromagnetism and capacitance integrated touch sensing function.

Due to the presence of the array substrate in the display panel and the arrangement pattern of the strip electrodes in each row of the sub-pixel electrodes according to the above embodiments, the transverse striation can be effectively avoided in the case that the rubbing orientation direction is deviated in rubbing or the polarizer is deviated in adhering, and thus the display panel has the above beneficial effect likewise.

Figure 8:
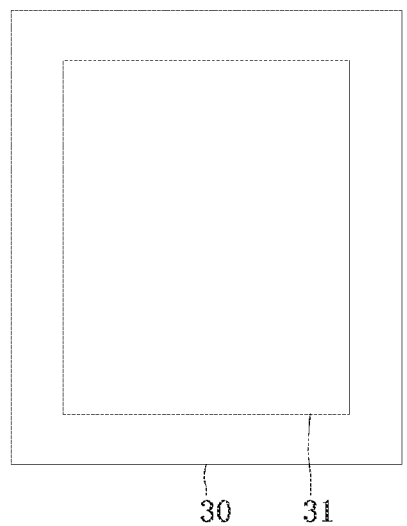
FIG. 8 is a schematic diagram of the structure of a display device, according to some embodiments of the disclosure.

FIG. 8 is a schematic diagram showing the structure of a display device according to some embodiments of the disclosure. Referring to FIG. 8, the display device 30 includes a display panel 31, and may further include a drive circuit and other devices for supporting a normal operation of the display device 30. The display panel 31 is the display panel according to the embodiments described in FIGS. 6A and 6B. The above display device 30 may be one of a cellphone, a desktop computer, a notebook, a tablet computer and an electric paper.

Since, the display panel, in which the transverse striation can be effectively avoided in the case that the rubbing orientation direction is deviated in rubbing or the polarizer is deviated in adhering, is provided in the display device, the display device has the above beneficial effect.

Various modifications and additions can be made to the embodiments discussed without departing from the scope of the disclosure. For example, while the embodiments described above refer to particular features, the scope of the disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:

1. An array substrate, comprising:
    a plurality of pixel units each comprising a 2×2 sub-pixel area matrix, with the 2×2 sub-pixel area matrix comprising a first sub-pixel area, a second sub-pixel area, a third sub-pixel area and a fourth sub-pixel area arranged in sequence; wherein
    each of the sub-pixel areas comprises at least two sub-pixel electrodes;
    each of the sub-pixel electrodes comprises a strip electrode;
    the strip electrode of at least one of the sub-pixel electrodes from each of the first sub-pixel area and the third sub-pixel area is parallel to a first direction;
    the strip electrode of at least one of the sub-pixel electrodes from each of the second sub-pixel area and the fourth sub-pixel area is parallel to a second direction;
    the first direction intersects with the second direction, to form an angle larger than 0° and smaller than or equal to 90° between the first direction and the second direction; and
    wherein, a first area is defined by the sub-pixel electrodes comprising the strip electrodes parallel to the first direction and the sub-pixel electrodes comprising the strip electrodes parallel to the second direction, and is provided with a sub-pixel switch.

2. The array substrate of claim 1, wherein:
    all of the sub-pixel electrodes from the first sub-pixel area, the second sub-pixel area, the third sub-pixel area and the fourth sub-pixel area have the same length;
    at least one of the sub-pixel electrodes from each of the first sub-pixel area and the third sub-pixel area is parallel to a first direction; and
    at least one of the sub-pixel electrodes from each of the second sub-pixel area and the fourth sub-pixel area is parallel to a second direction.

3. The array substrate of claim 2, wherein:
    each of the first sub-pixel area, the second sub-pixel area, the third sub-pixel area and the fourth sub-pixel area comprises two sub-pixel electrodes arranged in a 1×2 sub-pixel electrode matrix;
    the strip electrode of at least one of the sub-pixel electrodes from each of the first sub-pixel area and the third sub-pixel area is parallel to the first direction; and
    the strip electrode of at least one of the sub-pixel electrodes from each of the second sub-pixel area and the fourth sub-pixel area is parallel to the second direction.

4. The array substrate of claim 3, wherein:
    the strip electrode of each of the sub-pixel electrodes from each of the first sub-pixel area and the third sub-pixel area is parallel to the first direction; and
    the strip electrode of each of the sub-pixel electrodes from each of the second sub-pixel area and the fourth sub-pixel area is parallel to the second direction.

5. The array substrate of claim 4, wherein, the pixel unit comprises eight sub-pixel electrodes, including a first sub-pixel electrode, a second sub-pixel electrode, a third sub-pixel electrode, a fourth sub-pixel electrode, a fifth sub-pixel electrode, a sixth sub-pixel electrode, a seventh sub-pixel electrode and an eighth sub-pixel electrode arranged clockwise in sequence.

6. The array substrate of claim 5, wherein, the pixel unit further comprises:
    eight sub-pixel switches configured for controlling the eight sub-pixel electrodes, with each of the eight sub-pixel switches being disposed within a corresponding one of the first areas;
    two gate lines comprising a first gate line and a second gate line; and
    four data lines intersecting with the gate lines and comprising a first data line, a second data line, a third data line and a fourth data line;
    wherein, the first gate line is electrically connected with the first sub-pixel electrode, the second sub-pixel electrode, the third sub-pixel electrode and the fourth sub-pixel electrode; and the second gate line is electrically connected with the fifth sub-pixel electrode, the sixth sub-pixel electrode, the seventh sub-pixel electrode and the eighth sub-pixel electrode;
    the first data line is electrically connected with the first sub-pixel electrode and the eighth sub-pixel electrode, the second data line is electrically connected with the second sub-pixel electrode and the seventh sub-pixel electrode, the third data line is electrically connected with the third sub-pixel electrode and the sixth sub-pixel electrode, and the fourth data line is electrically connected with fourth sub-pixel electrode and the fifth sub-pixel electrode;
    wherein, each of the gate lines and each of the data lines are electrically connected with the sub-pixel switch corresponding to each of the sub-pixel electrodes.

7. The array substrate of claim 6, wherein:
    the first gate line comprises two branch lines parallel to each other in the pixel unit, with the two branch lines of the first gate line comprising a first branch line and a second branch line, wherein, the first sub-pixel area and the second sub-pixel are located between the first branch line and the second branch line; and
    the second gate line comprises two branch lines parallel to each other in the pixel unit, with the two branch lines of the second gate line comprising a third branch line and a fourth branch line, wherein, the third sub-pixel area and the fourth sub-pixel area are located between the third branch line and the fourth branch line.

8. The array substrate of claim 6, wherein:
    the first gate line comprises a branch line parallel to the data line in the first area so that the first gate line is electrically connected with the second sub-pixel electrode and the third sub-pixel electrode via the branch line of the first gate line; and the second gate line comprises a branch line parallel to the data line at the side of the third sub-pixel area away from the fourth sub-pixel area so that the second gate line is electrically connected with the fifth sub-pixel electrode via the branch line of the second gate line at the side of the third sub-pixel area away from the fourth sub-pixel area, and the second gate line includes a branch line parallel to the data line at the side of the fourth sub-pixel area away from the third sub-pixel area so that the second gate line is electrically connected with the eighth sub-pixel electrode via the branch line of the second gate line at the side of the fourth sub-pixel area away from the third sub-pixel area.

9. The array substrate of claim 6, wherein, the first data line is provided at the sides of both the first sub-pixel area and the fourth sub-pixel area away from the second sub-pixel area, the second data line is provided at the sides of both the first sub-pixel area and the fourth sub-pixel area close to the second sub-pixel area, the third data line is provided at the sides of both the second sub-pixel area and the third sub-pixel area close to the first sub-pixel area, and the fourth data line is provided at the sides of both the second sub-pixel area and the third sub-pixel area away from the first sub-pixel area.

10. The array substrate of claim 8, wherein, the pixel unit further comprises:
a first common electrode line and a second common electrode line, wherein,
the first common electrode line is parallel to the first gate line, and the first sub-pixel area and the second sub-pixel area are located between the first common electrode line and the first gate line;
the second common electrode line is parallel to the second gate line, and the third sub-pixel area and the fourth sub-pixel area are located between the second common electrode line and the second gate line; and
the first common electrode line comprises a branch line between the first sub-pixel electrode and the second sub-pixel electrode, the first common electrode line comprises a branch line between the third sub-pixel electrode and the fourth sub-pixel electrode, the second common electrode line comprises a branch line between the fifth sub-pixel electrode and the sixth sub-pixel electrode, and the second common electrode line comprises a branch line between the seventh sub-pixel electrode and the eighth sub-pixel electrode.

11. The array substrate of claim 2, wherein, each of the first sub-pixel area, the second sub-pixel area, the third sub-pixel area and the four sub-pixel area comprises three sub-pixel electrodes arranged in a 1×3 sub-pixel electrode matrix, the strip electrode of at least one of the sub-pixel electrodes from each of the first sub-pixel area and the third sub-pixel area is parallel to the first direction, and the strip electrode of at least one of the sub-pixel electrodes from each of the second sub-pixel area and the fourth sub-pixel area is parallel to the second direction.

12. The array substrate of claim 11, wherein, the strip electrode of one of the sub-pixel electrodes from each of the first sub-pixel area and the third sub-pixel area is parallel to the first direction, and the strip electrode of one of the sub-pixel electrodes from each of the second sub-pixel area and the fourth sub-pixel area is parallel to the second direction.

13. The array substrate of claim 12, wherein, the pixel unit comprises twelfth sub-pixel electrodes, comprising a first sub-pixel electrode, a second sub-pixel electrode, a third sub-pixel electrode, a fourth sub-pixel electrode, a fifth sub-pixel electrode, a sixth sub-pixel electrode, a seventh sub-pixel electrode, an eighth sub-pixel electrode, a ninth sub-pixel electrode, a tenth sub-pixel electrode, an eleventh sub-pixel electrode and a twelfth sub-pixel electrode arranged clockwise in sequence.

14. The array substrate of claim 13, wherein, the pixel unit further comprises:
twelve sub-pixel switches configured for controlling the twelve sub-pixel electrodes, with each of the twelve sub-pixel switches being disposed within a corresponding one of the first areas;
two gate lines comprising a first gate line and a second gate line; and
six data lines intersecting with the gate lines and comprising a first data line, a second data line, a third data line, a fourth data line, a fifth data line and a sixth data line;
wherein, the first gate line is electrically connected with the first sub-pixel electrode, the second sub-pixel electrode, the third sub-pixel electrode, the fourth sub-pixel electrode, the fifth sub-pixel electrode and the sixth sub-pixel electrode; and the second gate line is electrically connected with the seventh sub-pixel electrode, the eighth sub-pixel electrode, the ninth sub-pixel electrode, the tenth sub-pixel electrode, the eleventh sub-pixel electrode and the twelfth sub-pixel electrode;
the first data line is electrically connected with the first sub-pixel electrode and the twelfth sub-pixel electrode, the second data line is electrically connected with the second sub-pixel electrode and the eleventh sub-pixel electrode, the third data line is electrically connected with the third sub-pixel electrode and the tenth sub-pixel electrode, the fourth data line is electrically connected with fourth sub-pixel electrode and the ninth sub-pixel electrode, the fifth data line is electrically connected with the fifth sub-pixel electrode and the eighth sub-pixel electrode, and the sixth data line is electrically connected with sixth sub-pixel electrode and the seventh sub-pixel electrode;
wherein, each of the gate lines and each of the data lines are electrically connected with the sub-pixel switch corresponding to each of the sub-pixel electrodes.

15. The array substrate of claim 14, wherein:
the first gate line comprises two branch lines parallel to each other in the pixel unit, with the two branch lines of the first gate line comprising a first branch line and a second branch line, wherein, the first sub-pixel area and the second sub-pixel are located between the first branch line and the second branch line; and
the second gate line comprises two branch lines parallel to each other in the pixel unit, with the two branch lines of the second gate line comprising a third branch line and a fourth branch line, wherein, the third sub-pixel area and the fourth sub-pixel are located between the third branch line and the fourth branch line.

16. The array substrate of claim 14, wherein:
the first gate line comprises a fifth branch line and a sixth branch line parallel to the data line in the first area so that the first gate line is electrically connected with the first sub-pixel electrode and the second sub-pixel electrode via the fifth branch line of the first gate line, and the first gate line is electrically connected with the fifth sub-pixel electrode and the sixth sub-pixel electrode via the sixth branch line of the first gate line; and
the second gate line comprises a branch line parallel to the data line at the side of the fourth sub-pixel area close to the third sub-pixel area so that the second gate line is electrically connected with the ninth sub-pixel electrode and the tenth sub-pixel electrode via the branch line of the second gate line.

17. The array substrate of claim 14, wherein, the first data line is provided at the sides of both the first sub-pixel electrode and the twelfth sub-pixel electrode close to the second sub-pixel electrode, the second data line is provided at the sides of both the second sub-pixel electrode and the eleventh sub-pixel electrode away from the third sub-pixel electrode, the third data line is provided at the sides of both the third sub-pixel electrode and the tenth sub-pixel electrode away from the second sub-pixel electrode, the fourth data line is provided at the sides of both the fourth sub-pixel electrode and the ninth sub-pixel electrode away from the fifth sub-pixel electrode, the fifth data line is provided at the sides of both the fifth sub-pixel electrode and the eighth sub-pixel electrode away from the fourth sub-pixel electrode, and the sixth data line is provided at the sides of both the sixth sub-pixel electrode and the seventh sub-pixel electrode close to the fifth sub-pixel electrode.

18. The array substrate of claim 16, wherein, the pixel unit further comprises:
a first common electrode line and a second common electrode line, wherein, the first common electrode line is parallel to the first gate line, and the first sub-pixel area and the second sub-pixel area are located between the first common electrode line and the first gate line;
the second common electrode line is parallel to the second gate line, and the third sub-pixel area and the fourth sub-pixel area are located between the second common electrode line and the second gate line; and
the first common electrode line comprises a branch line between the second sub-pixel electrode and the third sub-pixel electrode, the first common electrode line comprises a branch line between the fourth sub-pixel electrode and the fifth sub-pixel electrode, the second common electrode line comprises a branch line between the eighth sub-pixel electrode and the ninth sub-pixel electrode and the second common electrode line comprises a branch line between the tenth sub-pixel electrode and the eleventh sub-pixel electrode.

19. The array substrate of claim 1, wherein, the sub-pixel electrode of the pixel unit is one of a red sub-pixel electrode, a green sub-pixel electrode, a blue sub-pixel electrode and a white sub-pixel electrode.

20. The array substrate of claim 19, wherein, the sub-pixel electrodes in the same column from the first sub-pixel area and the fourth sub-pixel area are of different colors, and sub-pixel electrodes in the same column from the second sub-pixel area and the third sub-pixel area are of different colors.

21. A display panel, comprising a first substrate, a second substrate, and a liquid crystal layer located between the first substrate and the second substrate, wherein, the first substrate comprises an array substrate, the array substrate comprising:
a plurality of pixel units each comprising a 2×2 sub-pixel area matrix, with the 2×2 sub-pixel area matrix comprising a first sub-pixel area, a second sub-pixel area, a third sub-pixel area and a fourth sub-pixel area arranged in sequence; wherein
each of the sub-pixel areas comprises at least two sub-pixel electrodes;
each of the sub-pixel electrodes comprises a strip electrode;
the strip electrode of at least one of the sub-pixel electrodes from each of the first sub-pixel area and the third sub-pixel area is parallel to a first direction;
the strip electrode of at least one of the sub-pixel electrodes from each of the second sub-pixel area and the fourth sub-pixel area is parallel to a second direction;
the first direction intersects with the second direction, to form an angle larger than 0° and smaller than or equal to 90° between the first direction and the second direction; and
wherein, a first area is defined by the sub-pixel electrodes comprising the strip electrodes parallel to the first direction and the sub-pixel electrodes comprising the strip electrodes parallel to the second direction, and is provided with a sub-pixel switch.

22. A display device, comprising a display panel, the display panel, comprising a first substrate, a second substrate, and a liquid crystal layer located between the first substrate and the second substrate, wherein, the first substrate comprises an array substrate, the array substrate comprising:
a plurality of pixel units each comprising a 2×2 sub-pixel area matrix, with the 2×2 sub-pixel area matrix comprising a first sub-pixel area, a second sub-pixel area, a third sub-pixel area and a fourth sub-pixel area arranged in sequence; wherein
each of the sub-pixel areas comprises at least two sub-pixel electrodes;
each of the sub-pixel electrodes comprises a strip electrode;
the strip electrode of at least one of the sub-pixel electrodes from each of the first sub-pixel area and the third sub-pixel area is parallel to a first direction;
the strip electrode of at least one of the sub-pixel electrodes from each of the second sub-pixel area and the fourth sub-pixel area is parallel to a second direction;
the first direction intersects with the second direction, to form an angle larger than 0° and smaller than or equal to 90° between the first direction and the second direction; and
wherein, a first area is defined by the sub-pixel electrodes comprising the strip electrodes parallel to the first direction and the sub-pixel electrodes comprising the strip electrodes parallel to the second direction, and is provided with a sub-pixel switch.

\* \* \* \* \*